United States Patent
Isshiki

(10) Patent No.: US 7,496,025 B2
(45) Date of Patent: Feb. 24, 2009

(54) OPTICAL DISC DRIVE APPARATUS WITH AN INDIRECT SEMICONDUCTOR LASER CONTAINING AN ASYMMETRIC QUANTUM WELL STRUCTURE

(75) Inventor: Fumio Isshiki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 579 days.

(21) Appl. No.: 10/082,314

(22) Filed: Feb. 26, 2002

(65) Prior Publication Data

US 2003/0095494 A1    May 22, 2003

(30) Foreign Application Priority Data

Nov. 19, 2001    (JP) .............................. 2001-352538

(51) Int. Cl.
   *G11B 7/00* (2006.01)
(52) U.S. Cl. .................... 369/121; 372/45.012
(58) Field of Classification Search ................. 369/121, 369/122
   See application file for complete search history.

(56) References Cited

U.S. PATENT DOCUMENTS

| | | | | |
|---|---|---|---|---|
| 5,153,889 | A * | 10/1992 | Sugawara et al. | 372/45 |
| 5,296,717 | A * | 3/1994 | Valster et al. | 257/13 |
| 5,354,707 | A * | 10/1994 | Chapple-Sokol et al. | 438/24 |
| 5,358,897 | A * | 10/1994 | Valster et al. | 117/89 |
| 5,365,535 | A * | 11/1994 | Yamaguchi et al. | 369/121 |
| 5,400,308 | A * | 3/1995 | Sugaya et al. | 369/15 |
| 5,592,501 | A * | 1/1997 | Edmond et al. | 372/45.011 |
| 5,625,729 | A * | 4/1997 | Brown | 385/31 |
| 6,072,196 | A * | 6/2000 | Sato | 257/87 |
| 6,394,665 | B1 * | 5/2002 | Hayashi | 385/88 |
| 6,452,215 | B1 * | 9/2002 | Sato | 257/79 |
| 6,741,538 | B2 * | 5/2004 | Momoo et al. | 369/112.01 |
| 6,815,736 | B2 * | 11/2004 | Mascarenhas | 257/201 |
| 6,828,594 | B2 * | 12/2004 | Yagi | 257/96 |
| 6,906,352 | B2 * | 6/2005 | Edmond et al. | 257/94 |
| 2002/0024153 | A1 * | 2/2002 | Yoshida et al. | 257/918 |
| 2004/0195509 | A1 * | 10/2004 | Sundaram et al. | 250/338.1 |

FOREIGN PATENT DOCUMENTS

| | | |
|---|---|---|
| JP | 57-187986 | 5/1981 |
| JP | 6-302003 | 4/1993 |
| JP | 05182229 A * | 7/1993 |
| JP | 2000-68610 | 3/1996 |

(Continued)

OTHER PUBLICATIONS

Electronic translation of JP 11-87831.*

(Continued)

*Primary Examiner*—Wayne R Young
*Assistant Examiner*—Adam R. Giesy
(74) *Attorney, Agent, or Firm*—Reed Smith LLP; Juan Carlos A. Marquez

(57) ABSTRACT

An indirect semiconductor laser having an indirect semiconductor used as the material of an active layer is used, instead of a conventional direct semiconductor laser so as to obtain a reproducing optical source, in order to reduce optical interference noise of the laser caused in the optical head in an optical disc apparatus, and to eliminate the necessity of high frequency wave convolution, thereby it is possible to reduce the cost.

20 Claims, 9 Drawing Sheets

FOREIGN PATENT DOCUMENTS

| | | |
|---|---|---|
| JP | 8-330680 | 5/1996 |
| JP | 09-306009 | 5/1996 |
| JP | 10-11781 | 6/1996 |
| JP | 11-87831 | 9/1997 |
| JP | 2000-138411 | 10/1998 |

OTHER PUBLICATIONS

Electronic translation of JP 5-182229.*

Suzuki, Tatsuya et al., Fabrication and Optical Characterization of Five-Layer Asymmetric Coupled Quantum Well (FACQW), Oct. 9, 2001, Japanese Journal of Applied Physics, vol. 41, pp. 2701-2706.*

Kononenko, V.K., Asymmetric Multiple-Quantum-Well Heterostructures: Conception, Properties, and Laer Chacteristics, May 23, 2000, Laser and Fiber-Optic Networks Modeling Conference, pp. 1-5.*

Lee, Bor-Lin and Ching-Fuh Lin, Wide-Range Tunable Semiconductor Lasers Using Asymmetric Dual Quantum Wells, Mar. 1998, IEEE Photonics Technology Letters, vol. 10, No. 3, pp. 322-324.*

F. Issiki, S. Fukatsu, Y. Shiraki, "Efficient luminescence from AIP/GaP Neighboring Confinement Structure with AIGaP Barrier Layers". 1995 American Institute of Physics, Appl. Phys. Lett 67 (8), Aug. 21, 1995, pp. 1048-1050.

N. Usami, F. Issiki, D.K. Nayak, Y. Shiraki, S. Fukatsu, "Enhancement of Radiative Recombination in Si-based Quantum Wells with Neighboring Confinement Structure", 1995 American Institute of Physics, Appl. Phys. Lett 67 (4), Jul. 24, 1995, pp. 524-526.

* cited by examiner $Si_{1-x}Ge_x$   Si   $Si_{1-2x}Ge_{2x}$   $Si_{1-x}Ge_x$

| | | |
|---|---|---|
| Be:GaP cap | 5nm | |
| Be:AlGaP graded | 1000nm | BARRIER LAYER 61 |
| AlGaP | 150nm | |
| GaP | 0.6nm | ACTIVE LAYER 60 |
| AlP | 2.5nm | |
| AlGaP | 150nm | BARRIER LAYER 61 |
| GaP buff | 50nm | |
| S:GaP (100) sub. | 650°C | SUBSTRATE 62 |

OPTICAL DISC DRIVE APPARATUS WITH AN INDIRECT SEMICONDUCTOR LASER CONTAINING AN ASYMMETRIC QUANTUM WELL STRUCTURE

BACKGROUND OF THE INVENTION

1. Field of the Invention

The present invention relates to an optical disc apparatus using an optical disc and light, for reproducing data recorded on the optical disc.

2. Related Art

These years, there has been used, in general, a semiconductor laser, specifically a semiconductor laser composed of a direct semiconductor, as a light source for light with which data is read (reproduced) from an optical disc recording thereon the data. That is, all semiconductor lasers which have been conventionally so-called are direct semiconductor lasers using a direct semiconductor as an active layer.

The semiconductor laser composed of a direct semiconductor is highly monochromatic, and is highly and intrinsically active to produce light having a single emission wavelength, and with no specific contrivement, the light is quantized with a length of a resonator, and tends to oscillate with a certain single wavelength. Accordingly, the oscillation spectra exhibit a very sharp intensity distribution as a needle with respect to a wavelength 53, as shown in FIG. 1 (Refer to a direction transmission type 2), and its typical half-value width is in general, less than 0.01 nm.

However, when intensity modulation is made to this laser beam in order to record or transmit data, the output light intensity does not smoothly change in accordance with a current value due to mode-mopping or the like on the way of variation of the output optical intensity, so as to cause a problem of producing the so-called laser noise. Further, although the semiconductor has exhibited an extremely high efficiency of light emission so as to be used as a light source for an optical disc apparatus of the light having excessively high interference and monochromatism is used as a light source for reproduction of an optical disc unit, partially reflected light from an optical component such as a lens, a reflector, a prism or a beam splitter interferes with a reproduction light beam which is inherently detected so as to produce optical interference noise which has been known as scoop-noise, resulting in detrimental affect upon the reproduction of signals. Such optical interference noise is caused by such a fact that the monochromatism of the laser source is too high, and accordingly, sharp optical interference is caused.

In order to prevent occurrence of such optical interference noise, there have been raised various proposals so as to contrive the structure of a laser element and a drive method thereof. This problem has been also discussed not only in the optical disc field but in the optical communication field, as stated in Japanese Laid-Open Patent No. H8-330680. In general, in order to solve the above-mentioned problem, there have been used a semiconductor laser of multimode oscillation type formed therein with a gain waveguide structure by doping, as disclosed in Japanese Laid-Open Patent No. H11-87831, a semiconductor laser having such a configuration that a saturable absorbing layer is formed so as to carry out self-modulation oscillation as disclosed in Japanese Laid-Open Patent No. 2000-68610, and a technique of high-frequency convolution in which a usual laser having a single emission wavelength is sued, and a laser exciting current is finely turned on and off by a high frequency wave so that the continuity of oscillation is cut off, that is, there have been taken the contrivement of preventing oscillation with a single wavelength. In particular, the technique of high frequency convolution is effective since it is capable of lowering laser noise, and accordingly, it has been prosperously used in the field of optical discs or optical communication.

However, the above-mentioned countermeasures have not been completely sure, the angular distribution of light emission becomes wider in a laser noise reduction method using self-oscillation, and it is likely to cause a problem of astigmatism at the lens. Further, even in the case of using the multi-mode oscillation type semiconductor laser, as disclosed in Japanese Laid-Open Patent No. H11-87831, there cannot be completely prevented such a mode hopping-like change in light volume that the emission wavelength intensity randomly varies while causing interference between bright lines, which mainly causes in particular optical noise during reproduction. Further, the high-frequency wave convolution disclosed in the Japanese Laid-Open Patent No. H11-87831 requires to arrange a high-frequency oscillation circuit in the vicinity of the laser, and accordingly, in a configuration in which both semiconductor laser and head should be moved, it is required to arrange the oscillation circuit on the movable head, and accordingly it mainly causes the costs to increase. Further, as the optical head becomes small-sized, the time by which the light beam goes away and comes back through the optical path becomes shorter, the frequency of the convolution wave should be increased further, and accordingly, it is required to take a countermeasure for preventing electromagnetic radiation. Thus, it mainly causes the costs to increase.

Further, even in any of the methods, as the recording density of an optical disc becomes higher, a margin for laser noise or optical interference noise becomes severe, thereby it is required to reduce the noise.

SUMMARY OF THE INVENTION

An object of the present invention is to provide an inexpensive optical apparatus from which a high frequency wave convolution circuit for preventing optical interference noise of laser, an oscillation circuit required for high frequency wave convolution, and a countermeasure for electromagnetic radiation are eliminated, which can speed up the reproduction speed of data while can lower the cost of the apparatus, and which can stably reproduce signals from an optical disc at a high rate.

To the end, according to the present invention, there are provided an optical head and an optical apparatus using an indirect semiconductor laser in which an indirect semiconductor is used as a light emitting layer (active layer), as a semiconductor laser for a light source, in stead of a conventionally used direct semiconductor laser using a direct semiconductor laser as a light emitting material.

First, explanation will be made of difference in emission spectra between the indirect semiconductor laser used in the present invention, and a conventional semiconductor laser (direct semiconductor laser).

Continuous Spectrum and Definition of Broad Band

As disclosed in Japanese Laid-Open Patent No. H6-302003 or Japanese Laid-Open Patent No. 2000-138411, the emission spectra of a conventional semiconductor laser (direct type) is typically a group of sharp peaks (blight lines) as shown in FIG. 18, in which spectra regularly and finely repeats increase and decrease with respects to wavelengths even in the case of any of self-oscillation, multi-mode oscillation and high frequency wave convolution, if measurement is made with a sufficiently high resolution, that is, about 0.01 nm. It is noted that the bright lines sated in this specification are emission lines having a line width (half-value width) sufficiently thinner than the resolution of a spectrometer in an emission spectrum measuring system. As to the regular increase and decrease, there is often exhibited a resonant mode corresponding to a length of a resonator for a laser element. The width of each one of the bright lines is typically less than 0.2 nm that is, the bright lines are very sharp. The reproducibility thereof can be confirmed at positions of concavities and convexities even through repetitions of measurement, and accordingly, the bright lines are clearly different from random noise which becomes zero if averaging is repeated. Thus it is clearly distinguishable.

On the contrary, a semiconductor laser using an indirect semiconductor as an active layer, as shown in the lower part of FIG. 1 of the accompanying drawings, refer to an indirect transient type 1, can exhibit an oscillation spectrum which is gently, having a half-value width of about 10 nm. FIG. 2 shows variation in emission intensity 51 (on the left side of FIG. 2) and emission spectra (on the right side of FIG. 2) in a current injection type light emission structure using an AlGaP group indirect semiconductor material as a light emission layer when the drive current 50 is changed. The color of the emission light beam is green. The details of the structure will be described in an embodiment of the present invention which will be explained later. As shown in the left side of FIG. 2, as the drive current 50 is increased (a, b, c, d), the emission intensity is abruptly and linearly increased (c to d) from a certain threshold (just before c) as a turning-point, that is, the so-called threshold characteristic is exhibited. This is the same as the characteristic which is exhibited by an usual semiconductor laser.

By the way, as shown in the right side of FIG. 2, the measurements of the emission spectrum at respective currents value a to d give a spectrum which does not have noticeable regular oscillation, but which exhibits a gentle mountain shape even though in a condition beyond the threshold value (c to d). Further, the half-value width of the peak extends over not less than about 10 nm which is about 1,000 times as large as that of a conventional single mode oscillation laser using, as a material, a direct semiconductor. This half-value width corresponds to 40 to 50 meV if it is converted into an energy range. This spectrum has concavities and convexities which are not greater than noise in the measuring system even though measurements are finely made with the resolution of 0.01 nm. Different from the direct semiconductor, no reproducibility is present even though measurements are repeated, and accordingly, with the repetitions of averaging, it becomes zero. Thus, the emission spectrum of a semiconductor laser using the indirect semiconductor is basically gentle and continuous, and continuous spectra are observed, similar to that of the sunlight even the measurements are made finely, up to 0.01 nm of the resolution. According to the present invention, the above-mentioned gentle spectrum is referred to as "continuous spectrum" similar to the physical definition to the continuous spectrum in the black body radiation.

That is, the indirect semiconductor laser exhibits the threshold characteristic, similar to that of a usual direct semiconductor laser, and it is different in view of such a point that the emission spectrum is relatively broad and continuously gentle although it causes a self-induced emission (the so-called laser oscillation).

This is a unique spectrum during self-induced radiation, which is exhibited in the case of using an indirect semiconductor as a active layer. In this specification, a light beam emitted in this condition will be referred as a laser beam of the indirect semiconductor. Further, in this specification, the oscillation of the laser beam with such a continuous spectrum will be referred as broad band oscillation, and the indirect semiconductor light emission element will be referred as an indirect semiconductor laser.

It is noted that the structure of the laser element will be described later in the embodiment.

Thus, it is explained that the reason why the indirect semiconductor emits a self-induced radiation light beam of a gentle and continuous spectrum, different from the radiation light beam from the direct semiconductor laser, is the presence of optical transition (indirect transition) by way of an intermediate condition in the indirect semiconductor. Explanation will be hereinbelow made of this matter.

FIG. 3 shows an electronic state band structure with respect to a wave number vector in an indirect semiconductor, in which a solid line exhibits an example of a band structure of a semiconductor of the indirect transient type 1, and a dotted line exhibits an example of a semiconductor of a direct transient type. A wave number 7 is taken on the abscissa.

In the case of the direct semiconductor (dotted line), the lower end of a conduction band is located at the same point ($\Gamma$ point) as a point which is the top of a valence band 4 in a wave number space. Electrons 5 accumulate at the bottom of the conduction band while holes (electron holes) 6 accumulates on the top of the valence band. A hole (electron hole) and an electron which are located at the same position in the wave number space are likely to cause emission transition (optical transition or optical recoupling) since their crystal translational symmetries coincide with each other. In the case of the direct semiconductor, the lower end of the conduction band 3 is located right above the top of the valence band 4, as indicated by the dotted line. Accordingly, the electron and the hole can directly carry out emission transition so as to be highly active as to emission and optical absorption, and therefore it is likely to cause laser oscillation by injection of current. This is the reason why the direct semiconductor is used in general as a material of a semiconductor laser element. However, if the degree of the optical activity thereof is too high, it sensitively reacts with light returned from the outside, and accordingly, it is likely to cause effects including interference resonation. This contrarily causes optical noise in laser.

Meanwhile, as indicated by the solid line, in such a case that the lower end of the conduction band 3 is located obliquely above the top of the valence band 3, the direct emission transmission can not be made. Accordingly, it is required to carry out transition twice successively by a certain intermediate condition with any other scattering factor or interaction in order to cause emission transition. This is so-called as indirect transition. Further, a semiconductor of a king having such a band structure is called as an indirect semiconductor. For example, in an AlGaP group indirect semiconductor, the lower end of the conduction band 3 is located around an X point, and has a configuration as shown in FIG. 3.

The mechanism of light emission in this indirect semiconductor will be explained as follows:

Electrons 5 accumulated in the bottom of the conduction band 3 are present obliquely above the holes in the wave number space, and accordingly they cannot be directly recombined with the holes 6 (emission). In order to effect transition so as to emit light, interaction with lattice vibration which is so-called as Phonon, spatial potential fluctuation such as interface heterogeneity, composition heterogeneity or the like is required. The intermediate condition does means a temporary quantum state which is present in a forbidden band so that it cannot exist for a long time, and accordingly, a time by which the electrons can stay at this level is very short. Accordingly, an electron which is temporarily shifted into the intermediate condition, soon finds out an electron hole 6 so as to recombine therewith (light emission) or it is required to soon return again to the bottom of the conduction band 3. Thus, since the indirect transition goes through a level at which the duration ($\Delta t$) is very short (in the intermediate condition). The energy range $\Delta E$ of the optical transition which can interact with the photoelectric field therearound becomes very wide due to the uncertainty principle $\Delta t * \Delta E \sim h$ (where h is Plank's constant). Thus, the optical gain which would be a $\delta$-function (<0.01 nm) in the case of the direct semiconductor laser, becomes typically not less than 10 nm which is very wide during indirect transmission.

Accordingly, by a light beam, a return light beam or the like which goes and come backs through the resonator a next light emission transition is induced in a wide energy range of $\lambda\pm$ several nm in the case of application of an external photoelectric field of the wavelength $\lambda$. As a result, an emitted light beam having a peak which has a width relatively large in comparison with that of the conventional direct semiconductor laser, is induced. If the concentrations of the electrons and the electron holes are sufficiently high, the self-induced emission is caused.

Thus emitted light beam having a wide spectrum, the increase and decrease of interference light with each of wavelengths are cancelled out each other, substantially no optical interference noise caused by a return light beam in an optical head is caused. For example, FIGS. 17a and 17b show an example of optical interference noise which occurs in the optical head when the distance between an optical medium and the optical head varies and which is referred as fringe noise. In these figures, time 54 is taken on the abscissa, and the intensity 55 of reflected light is taken on the ordinate. In the case of using the indirect semiconductor laser having a high monochromaticity and sharp spectra (FIG. 17a), optical interference noise having a fringe pattern as shown in FIG. 17a is caused due to optical interference caused by a height of the monochromaticity when the distance between a disc medium and the optical head varies. On the contrary, in the case of using the indirect semiconductor laser (FIG. 17b), since the spectrum of the emitted light beam is wide, strength and weakness of the optical interference at each of the wavelengths are cancelled out with each other, and accordingly, substantially no fringe noise is cased, as shown in FIG. 17b. Further, since the optical activity of the indirect transition is not so high, the reaction to a return light beam from the outside is gentle, and accordingly, external optical interference and resonance can hardly occur. Due to this fact, laser noise from the laser element itself can hardly occur, and accordingly, there is offered such an advantage that a light source having low noise can be obtained.

Thus, as mentioned above, in the indirect semiconductor laser noise, laser oscillation producing very low noise can be obtained with a smooth continuous spectrum.

The width of a gain range with respect to an external photoelectric range in this condition is determined mainly in dependence upon a distribution of carriers accumulated on the bottom of the conductive band, and accordingly, it has an oscillation spectrum which is wide and broad, extending over several tenth meV, as shown in FIG. 2. The width of the spectrum is determined mainly by an energy distribution of the carriers (electrons and electron holes) which is in turn determined by several factors including fluctuation at the interface of a quantum well structure, a relaxation rate of the carriers which relaxes in the quantum well and a carrier temperature. For example, in the case of the room temperature (300K), since the carrier temperature is higher than the usual room temperature, the half-value width of the emission spectrum is not less than the energy width (30 meV× 69%=about 20 meV) which is attenuated down to a half distribution density due to an exponential function (EXP) of the energy (about 30 meV) of the room temperature. Accordingly, unless the gain restraint by the resonator is made in particular, the oscillation can be, in principle, made at a half-value width which is wide, that is, not less than 20 meV. This is not less than 6 nm in the case of AlGaP group or 13 nm in the case of SiGe group if the light beam is green around a wavelength of 500 nm. This value is wider than the half-value width (which is typically <0.01 nm) of oscillation during d.c. excitation (single mode oscillation) by not less than 2 orders. Further, it means that this half-value width exhibits such a characteristic that laser noise due to conventional optical interference can be suppressed greatly by not less than 2 orders.

It is noted that the actual value of the half-value width is comprehensively determined in accordance with various factors including a temperature, a structure, a level density, a transient durability of each level and an exciting intensity. The half-width value is limited by a band discrete quantity (a band offset energy) which determines the depth of a quantum well as a light emission structure, and this value can be set by a design term such as a composition of each of films of a semiconductor structure. The specific value is about 400 meV in the AlGaP group but 150 meV in the SiGe group, and as to the half-value width of a wavelength, the upper limit values are automatically limited to about 100 nm in the AlGaP group but about 90 nm in the SiGe group.

As mentioned above, since the indirect semiconductor laser using an indirect semiconductor as an active layer, autonomously oscillates in a broad wavelength range, and accordingly, can serves as a light source which does not produces optical interference noise. With the use of the indirect semiconductor laser as a light source, optical interference noise and laser noise which have occurred in optical disc apparatus can be greatly improved.

The present invention will be hereinbelow detailed in the form of preferred embodiments with reference to the accompanying drawings in which:

Other objects, features and advantages of the invention will become apparent from the following description of the embodiments of the invention taken in conjunction with the accompanying drawings.

DESCRIPTION OF PREFERRED EMBODIMENTS OF THE INVENTION

Explanation will be hereinbelow made of embodiments of the present invention with reference to FIGS. 4 to 16.

Embodiment 1

Structure of Indirect Semiconductor Laser

Explanation will be made of the light emission structure of the above-mentioned indirect semiconductor laser as measures for solving the problems concerned by the present invention with reference to FIGS. 4 to 13.

Figure 1:
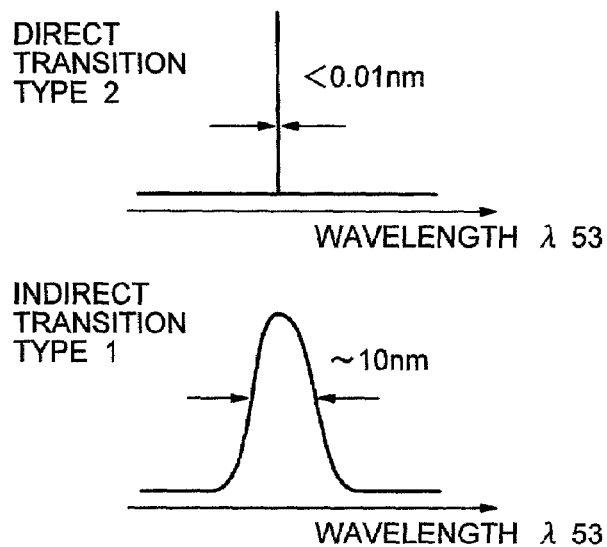
FIG. 1 is a view showing a difference in typical spectrum between a conventional direct semiconductor laser and an indirect semiconductor laser according to the present invention.
Figure 2:
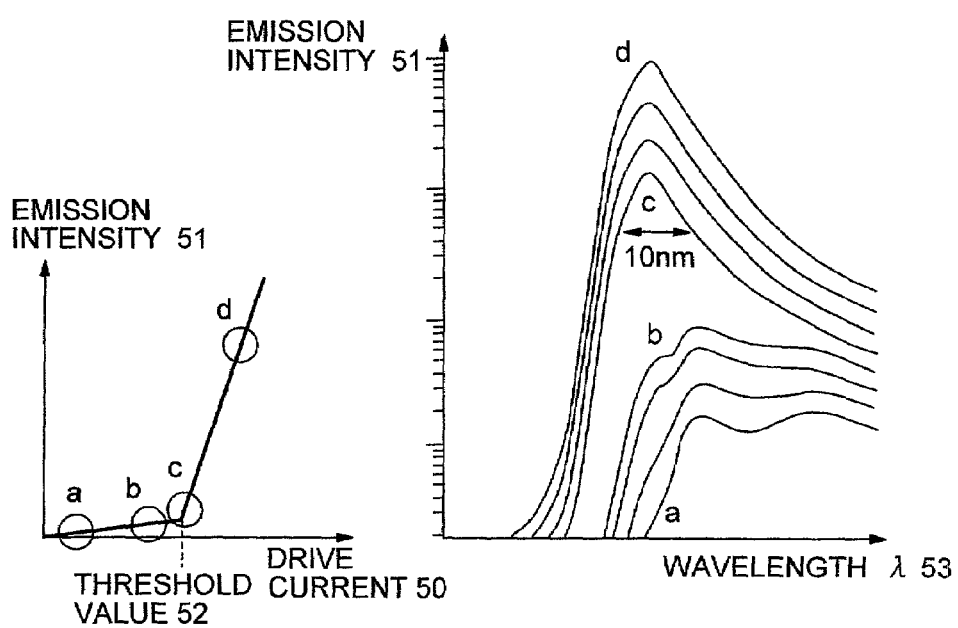
FIG. 2 is a view showing a drive current dependency of light emission intensity and light emission spectrum of an indirect semiconductor laser.
Figure 3:
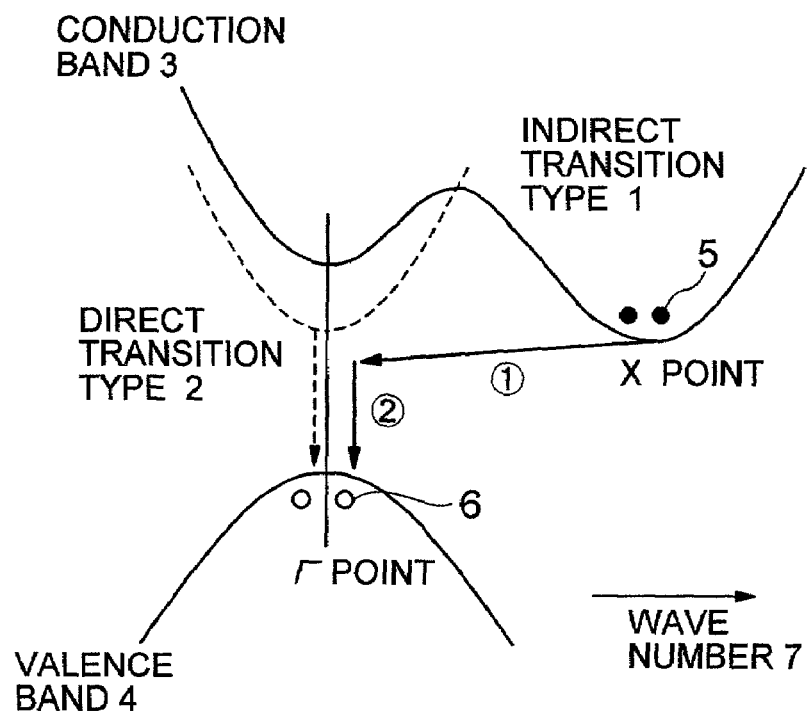
FIG. 3 is a view illustrating a band structure of the indirect semiconductor in a wave number space and a process of light emission transition.

The light emission structure of the semiconductor used in FIG. 2 of the accompanying drawings, is a quantum well structure which is so-called as an adjacent confinement structure. At first this quantum well structure will be explained.

Definition of Quantum Well Structure

Figure 4:
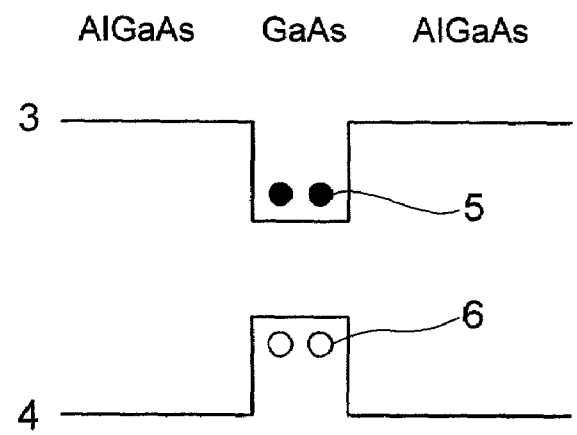
FIG. 4 is a view illustrating a band structure of a type 1 of a semiconductor quantum well.
Figures 5A, 5B:
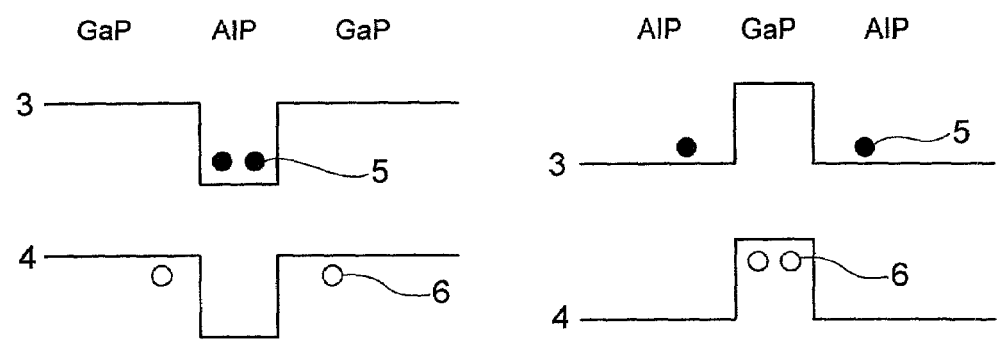
FIGS. 5a and 5b are views respectively illustrating examples of a band structure of a type 2 of a semiconductor quantum well.

In general, in the case of manufacturing a light emission element from a semiconductor, it is often to form a PN junction by jointly using thin film growth. By laminating semiconductor materials with the use of a metal-organic vapor phase epitaxy growth (MOVPE) process, a molecular beam eptaxy (MBE) process or a gas source molecular beam epitaxy (MOVPE) process, there can be a multilayer structure in which different materials are laminated one upon another in combination of various thickness. At this stage, by interposing materials having conductive bands with lower ends which are located at different positions, between other kinds of materials, a structure in which electrons are accumulated at a lowest energy level can be built up, as shown in FIG. 4. This structure is named as a quantum well structure, in which electrons are accumulated in a cave of the conduction band while holes (electron holes) are accumulated on the top of a valence band. Each of the conduction band and the valence band is called as a band structure, and FIG. 4 shows a band structure pattern having energy levels of the above-mentioned quantum well structure which are typical energy levels located at, for example, at upper and lower ends. As to the band structure of the quantum well structure, there are presented a structure which is called as a type 1 and in which electrons and holes are confined in one and the same layer, and a structure which is called as a type 2 and in which only electrons or holes are confined as shown in FIGS. 5a and 5b.

Definition of Adjacent Confinement Structure

Next, explanation will be the structure which is called as an adjacent confinement structure stated in this specification.

Figure 6:
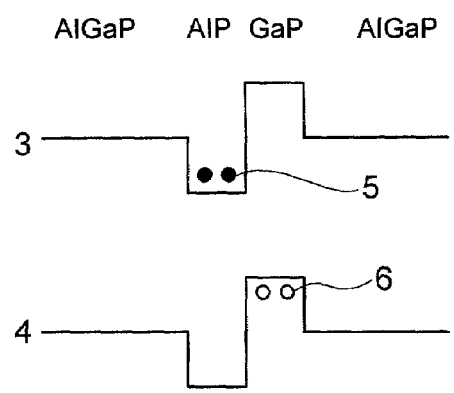
FIG. 6 is a view illustrating an example of the band structure in an adjacent confinement structure by an AlGaP group.
Figures 7, 8:
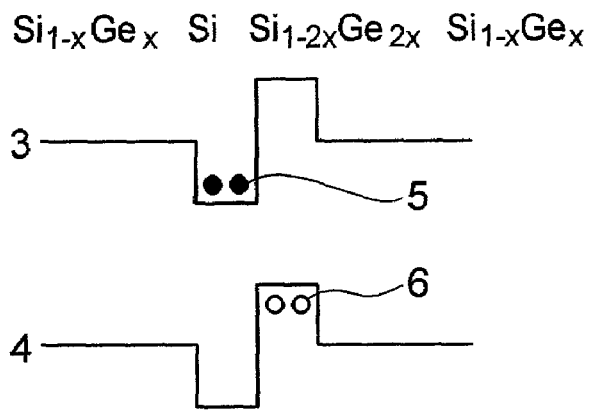
FIG. 7 is a view illustrating an example of a band structure of an adjacent confinement structure by an SiGe group.
FIG. 8 is a view illustrating an example of a sample structure of an indirect semiconductor laser by an AlGaP group adjacent confinement structure.

In the case of the type 2 of the quantum well structure, if a usual single layer quantum well is used, either electrons or holes are alone confined in the quantum well. In order to cause light emission, it is required to allow electrons and holes to juxtapose to each other, and accordingly, a structure in which an electron confinement layer and a hole confinement layer are located being adjacent to each other, and both layers are interposed at opposite sides thereof between barrier layers for confining both electrons and holes, is required. This adjacent confinement structure is materialized by using a group of materials constituting the type 2 of the quantum well. As to this structure, in the case of using, for example, an AlGaP group semiconductor materials, an AlP layer and a GaP layer are adjacent to each other, and they are interposed at opposite sides thereof between AlGaP layers having a composition around 0.5, as shown in FIG. 6. In this adjacent confinement structure, both electrons and holes can be confined so as to enhance the efficiency of light emission recombination thereby to offer such an advantage that the efficiency of a light emission element can be enhanced. The AlGaP group adjacent confinement structure is disclosed in Applied Physics letters, Vol. 67, Page 1,048. Further, the adjacent confinement structure can be formed with an SiGe group indirect semiconductor. For example, a structure in which an Si layer and an SiGe layer in which the density of Ge composition is high are juxtaposed with each other, then they are interposed at opposite sides thereof between SiGe layers in which the density of the composition is intermediate, and thereafter all are laminated on a relaxation SiGe layer, may be formed as shown in FIG. 7. The SiGe group adjacent confinement structure is detailed in Applied Physics Letters. Vol 67, Page 524. The method of forming the above-mentioned structures can be made with reference to the above-mentioned two documents in Applied Physics Letters. Further, a specific manufacturing method of the AlGaP group adjacent confinement structure will be explained later with reference to FIG. 8.

Definition of Asymmetric Quantum Well Structure

Next, explanation will be made of definition of an asymmetric quantum well structure according to the present invention.

In the type 1 of the semiconductor quantum well structure as shown in FIG. 4, a band structure is left-right symmetric with respect to the center of the quantum well layer. Further, in the type 2 of the semiconductor well structure as shown in FIGS. 5a and 5b, the band structure is left-right symmetric although the symmetry of a valence band and a conduction band is reversed. On the contrary, in an adjacent confinement structure shown in FIGS. 6 and 7, the band structure is left-right asymmetric with respect to the center of the quantum well structure. As mentioned above, the quantum well structure having the asymmetric band structure will be referred as the asymmetric quantum well structure.

In the type 2 of the asymmetric quantum well structure, the positions of the centers of distribution in the confinement layers for electrons and holes are different from each other, and accordingly, the spatial electric field varies simultaneously with extinction of electrons and holes during light emission. Accordingly, even with the indirect semiconductor, a provability of interaction of optical energy is always present, irrespective of the symmetry of atoms so as to offer such an advantage that the light emission transition can be possibly caused. That is, in the quantum well structure of the indirect semiconductor, a certain degree of optical transition provability can be ensured even with indirect transition with the use of an asymmetric quantum well structure, thereby it is possible to enhance the efficiency of light emission.

It is noted that the adjacent confinement structure is a one of asymmetric quantum well structures, and can exhibits merits of the above-mentioned advantages.

Definition of Active Layer

Next, explanation will be made of the definition of the active layer in the present invention.

In the adjacent confinement structure, carriers of electrons and holes are accumulated in an AlP layer and a GaP layer. A layer (quantum well layer) which can effects such a condition that the carriers are accumulated so as to give an optical gain will be referred as an active layer in this specification. In such a case that the type 2 quantum well structure as the adjacent confinement structure is formed, although an electron confinement structure and a hole confinement structure are spatially separated from each other, a condition in which an optical gain can be obtained is produced if these layers are adjacent to and paired with each other, and accordingly, both confinement layers will be called as active layers, respectively. On the contrary, layers with which the active layer is interposed therebetween will be referred as barrier layers, respectively. In this case, the AlGaP layers correspond to barrier layers.

AlGaP Laser Structure

Next, the specific element structure of the AlGaP group indirect semiconductor laser shown in FIG. 2 will be explained. A film structure of a laser chip is shown in FIG. 8. A manufacturing method with the use of a gas source molecular beam epitaxy process (GSMBE process) will be hereinbelow explained.

The following structures are grown successively on a GaP (100) substrate doped with sulfur at a temperature of 650 deg. C. A GaP layer having a thickness of 50 nm, an AlGaP layer having a thickness of 150 nm, which serves as a barrier layer, an AlP layer having a thickness of 0.6 nm, which is an active layer and which serves as an electron side well, a GaP layer having a thickness of 0.6 nm, which serves as a hole side well, an AlGaP layer having a thickness of 150 nm, which serves as a barrier layer, an AlGaP layer having a thickness of 1,000 nm and doped with Be, which also serves as a barrier layer, and a GaP layer having a thickness of 5 nm and doped with Be, which serves as a cap layer are formed successively in the mentioned order. A wafer having the above-mentioned thin film structure may be formed by, for example, a MOCVD process, in addition to the GSMBE process. The combination of materials in the above-mentioned layer structure can be controlled by opening and closing a shutter in, for example, the GSMB process. However, it can be controlled by opening closing a gas valve for material gas in the MOCVD process.

The wafer for laser, which can be obtained as mentioned above, is cleaved, and then, end faces (mirror surfaces) are laid in parallel with one another so as to form a resonator.

It is applied to the substrate (S: GaP) side of this chip, and annealing is made for 2 minutes at a temperature of 350 deg. C. so as to form an Ohmic electrode which serves a negative (−) electrode. Meanwhile, as to an electrode on the cap layer side, In is deposited by soldering or evaporation at a temperature of 250 deg. C. so as to form a positive (+) electrode directly through Schottky joint.

It is noted that although the case of using the GaP substrate which has a less difference in lattice constant as a substrate has been explained in this embodiment, it is possible to manufacture a construction on a different substrate such as a GaP crystal laminated on Si, and accordingly, the substrate material should not be limited to the above-mentioned indirect semiconductor material. If the active layer which cause light emission (radiation of light) is the indirect semiconductor, the light emission characteristic can be obtained basically as indirect transition.

The thus obtained laser chip is fixed to a cooler so as to be cooled, and a voltage is applied between both electrodes formed on the chip so as to obtain the light emission spectrum show in FIG. 2.

Upon application of this voltage, it is required to moderately increase a drive current around the laser threshold value in order to obtain broad light emission as shown in FIG. 2.

Figure 9A:
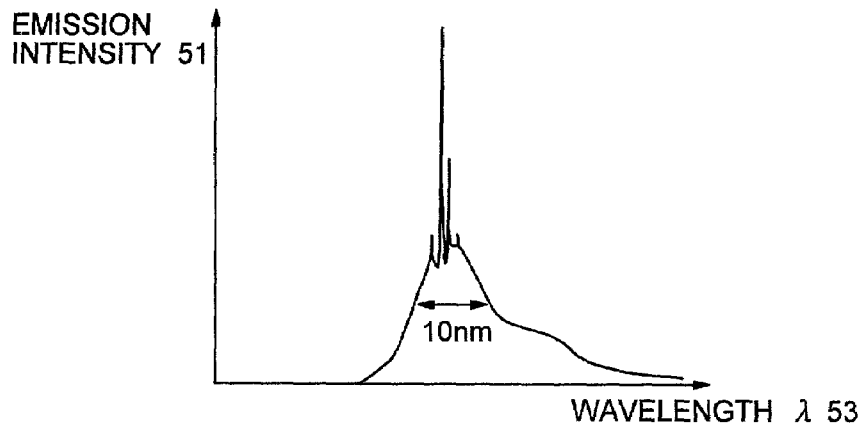
FIGS. 9a and 9b are views showing an example of a light emission spectrum during local strong excitation in an AlGaP group indirect semiconductor laser.
Figure 9B:
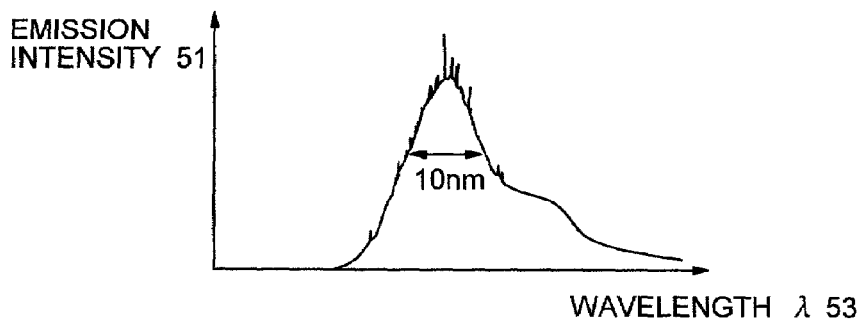

Should an abrupt voltage having a sharp waveform be applied to the chip, oscillation would occur in a single mode (an oscillation mode in which a single shape peak is present on a spectrum) as shown in FIG. 9a or a multimode (an oscillation mode in which several sharp peaks are present on a spectrum) as shown in FIG. 9b before the emission spectrum becomes sufficiently wider (before oscillation in a broad band is stabilized).

This phenomenon can be explained as follows:

In comparison with a direct semiconductor, the indirect semiconductor has such a property that carriers which are accumulated in the semiconductor are diffused through crystal by a long distance. Once the carriers are sufficiently diffused, large volume of current is required in accordance with an area of the active layer. However, should a large volume of current be immediately fed initially, it would cause such a condition that strong excitation occurs only around the electrodes before the carriers are sufficiently diffused since the diffusion of the carrier cannot follow up soon. With such local strong excitation, since a local gain resonant condition is created, a gain resonator structure temporarily having a sharp gain is formed, and accordingly, oscillation in a single mode or a multimode is caused. In the oscillating condition in each of these modes, optical interference noise or laser noise is caused, similar to the direct semiconductor laser. As to this phenomenon, in the case of the direct transition type, it is likely to cause oscillation with a broader spectrum if the drive current pulse is made to be sharper. On the contrary the indirect semiconductor laser may be in contrast with the direct semiconductor laser in view of such a point that a stable broad band cannot be obtained if the pulses is sharper.

A variation in drive current around the threshold value around which the spectrum shape greatly varies is important for stable oscillation in a broad band. In a part around the threshold value, the spectrum shape abruptly varies so as to become instantly unstable, and accordingly, it is likely to shift into oscillation in a single mode or a multimode. Since the indirect semiconductor laser inherently has such a characteristic that it oscillates in a broad band, if the spectrum is changed moderately around the threshold value in order to prevent the oscillation from shifting into an unstable mode, the oscillation is shifted into oscillation in a stable mode.

Figure 10:
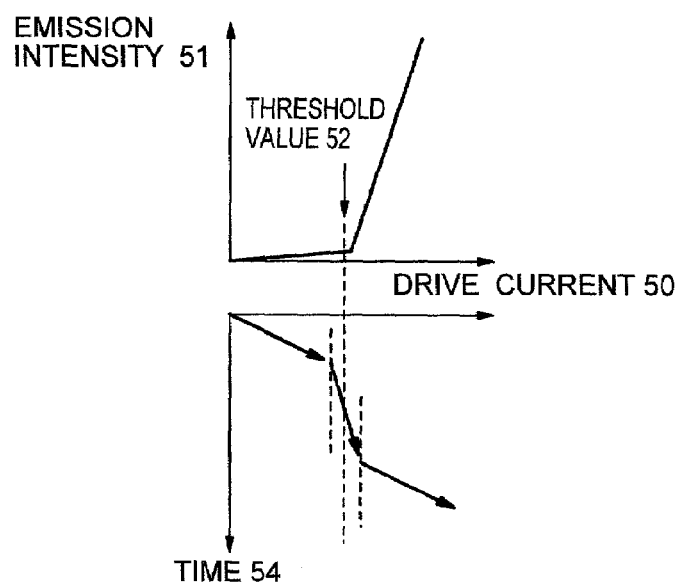
FIG. 10 is a view for stably explaining a current drive method of stably oscillating an indirect semiconductor laser in a broad band.
Figure 11:
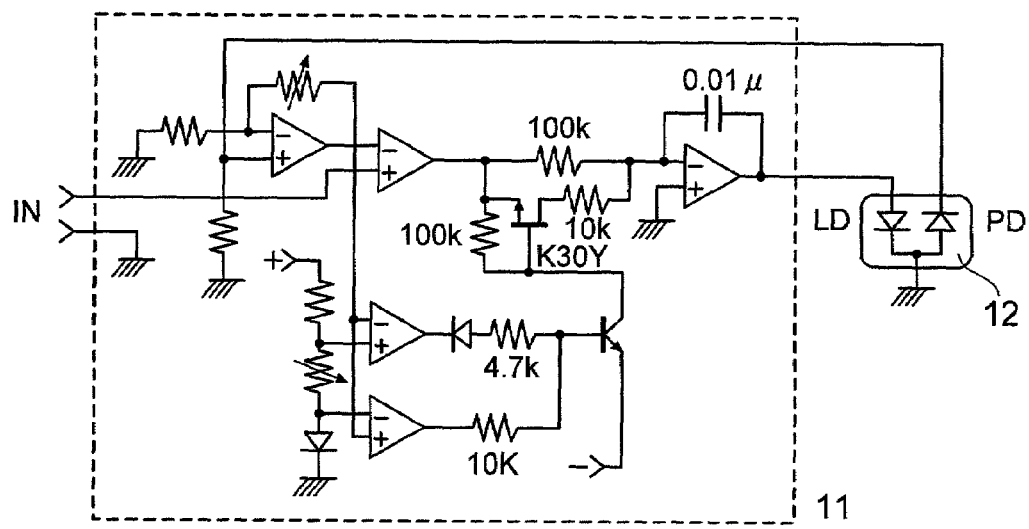
FIG. 11 is a view illustrating a circuit configuration of a driver for stably oscillating an indirect semiconductor laser in a broad band.

Accordingly, it is required for exciting the laser to moderately and gently increase the drive current 50 with respect to the time 54, in particular around the threshold value as shown in FIG. 10 so as to prevent generation of a sharp peak as in the single mode or a multiple mode, in order to stably obtain light emission of a continuous spectrum. Specifically, as shown in FIG. 11 which is a circuit diagram, it had be better to use a laser driver added with a function capable of restraining the increasing rate of current around the threshold value. In this circuit, a light emission intensity of the indirect semiconductor laser (LD) is detected by a pack monitor (PD), and only when the light volume passes through a constant value (threshold value), the increasing rate of the current is limited to one-tenth so as to charge a capacitor while it is driven so as to gently increase the current. The resistance values which are not applied with values are determined by adjusting them in accordance with a sensitivity of the pack monitor (PD) and the threshold value. When the indirect semiconductor laser is incorporated in an optical head or an optical disc apparatus, if it is desired to frequently change the output power of the laser, the laser driver which can carry out current control in consideration with the threshold value as mentioned above is required. However, since d.c. current may be used for the drive current, it is not required to locate the driver circuit itself in the vicinity of the laser, different from the drive with the high frequency wave convolution. That is, since no high frequency wave convolution is required, the d.c. drive can be made, and accordingly, the freedom of arrangement and mounting thereof can be increased. Without using a high frequency wave convolution, the d.c. drive in which the change in current is gentle is used, and accordingly, oscillation with a broad spectrum which is essential in the laser using an indirect semiconductor can be stably obtained.

Figure 12:
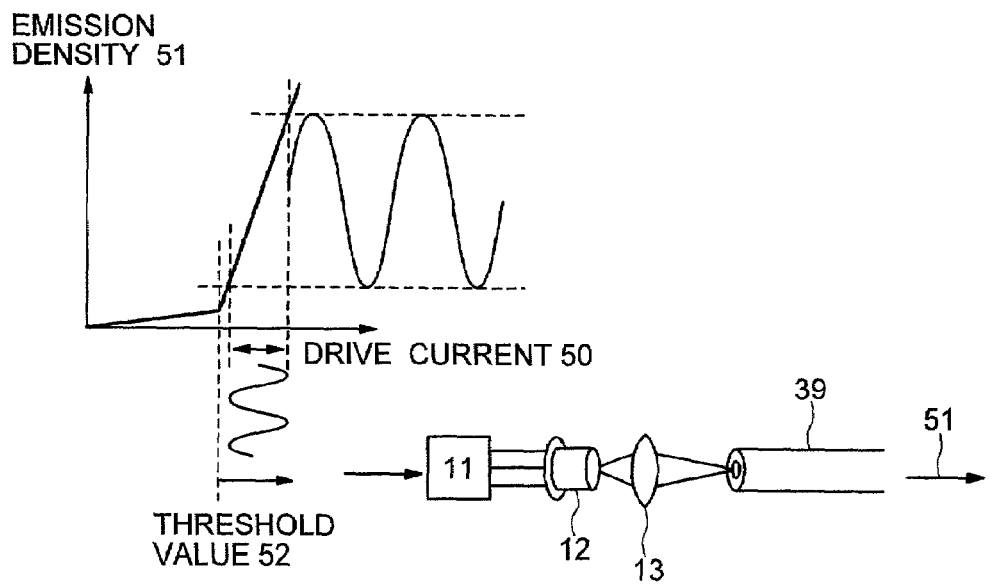
FIG. 12 is a view for explaining a method of modulating a laser beam, which is preferably for application of an indirect semiconductor laser to data communication equipment.

If it is required to modulate the output light intensity of the laser for recording, the drive current should be always controlled so as to hold the drive current above the threshold value during recording. This is similar to the application of the indirect semiconductor laser and the driver therefore into data communication equipment which carries out modulation for data transmission, and in this case, as shown in FIG. 12, as to a light beam delivered to a fiber, the drive current should be set above the threshold drive current during data transmission, without completely dropping the drive current to zero. In particular, in the case of analog transmission or multiplex multi-value transmission, if the interference can be lowered so as to eliminate mode resonance or interference in the fiber in order that no noise is caused by laser, a slight change in analog value can be precisely and simply transmitted, thereby it is possible to prevent the transmission data from being deteriorated. When the drive is carried out with a current value greater than the threshold value, the drive current can be prevented from passing the threshold value at which the laser becomes unstable, the data can be modulated at a high rate.

Further, in the case of modulation of a laser beam for recording or data transmission with the additional use of a modulator, the light beam from the indirect semiconductor laser can prevent occurrence of optical interference within the modulator, and accordingly, there is offered such an advantage that the intensity can hardly vary due to any cause other than modulation, Thus, the indirect semiconductor laser is useful in the case of the modulation with the use of the additional modulator (including the case of application to data communication equipment). At this stage, it is required to use an absorption type optical modulator which does not require an optical interference effect.

As to Group of Materials

As to the material of the indirect semiconductor from which a laser with less laser noise can be manufactured, the above-mentioned AlGaP group mixed crystal materials or the SiGe group mixed crystal materials may be used. On the contrary, as to the material group used for an usual semiconductor laser, an AlGaAs group materials, an InAlGaP group materials which are used in a semiconductor laser as a light source in a DVD optical head having an emission wavelength of 50 nm, and both InGaN group and InAlGaN group materials which are used in a blue semiconductor laser are typical, and are all semiconductors of direct transition type.

The AlGaP group is a lattice matching group, and exhibits such an advantage that satisfactory crystal can be manufactured even though a laminated structure having a large thickness is manufactured. Since it is likely to accumulate carriers on the barrier layer for a quantum well in an indirect semiconductor in which the durability of carriers is long in the active layer, materials and a composition are selected so as to allow not only the active layer but also the barrier layer to become the indirect transient type, non-emission recombination of carriers due to impurities on the barrier layer can be reduced, thereby it is possible to offer such an advantage that the efficiency of light emission can be enhanced.

Further, since the indirect semiconductor occupies all composition range, a quantum well having a sufficient depth can be formed by maximumly effecting a band gap which is present at an interface where compositions are different. Further, since the indirect semiconductor occupies all composition range, fluctuation in the composition of mixed crystal and the formation of a local radiation center at an interface between different composition layers are prevented, thereby it is possible to cause stable indirect transition.

Further, since the SiGe group has a satisfactory compatibility with a light receiver (PIN photodiode or the like) for existing integrated circuits or optical disc apparatus, or an Si process, an amplifier or a signal processing circuit required for the optical head can be integrally incorporated, thereby it is possible to offer such an advantage that the cost can be lowered. Further, it has been confirmed that SiGe is also a material which allows the indirect semiconductor to occupy in the entire composition range, and accordingly, the adjacent confinement structure can enhance the efficiency of light emission.

Combination of Distribution Bragg Reflector and Cooler

Figure 13:
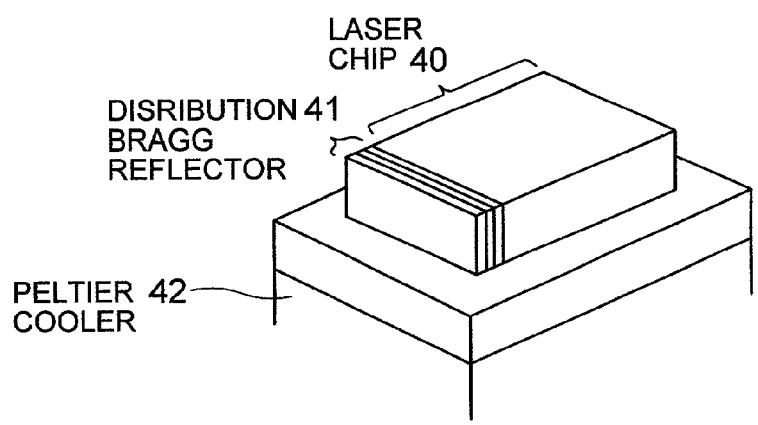
FIG. 13 is a view for explaining an arrangement of a distribution Bragg reflector and a cooler for a laser chip.

In such a case that the half-value width of the spectrum of the indirect semiconductor is too wide so as that aberration of a lens causes a problem, a distribution Bragg reflector (DBR) is formed at one of side end faces of the laser so as to improve the half-value width. The distribution Bragg reflector is a kind of multi-layer reflection films, and has a continuous and mountain-like gain distribution as to reflectance diffusion with respect to wavelengths, and accordingly, the gain of the resonator can be totally adjusted by changing the period or the number of laminated layers thereof. The distribution Bragg reflector can be materialized by laminating multi-layers having different refraction indices, ¼ wavelength by ¼ wavelength. For example, quartz ($SiO_2$) having a thickness of 95 nm and titanium oxide ($TiO_2$) having thickness of 60 nm are alternately laminated one upon another, by several to several ten periodical layers. It is noted that the specific film thickness thereof is adjusted more or less in accordance with a refraction index which varies in dependence upon a manufacturing condition. This distribution Bragg reflector 41 is located at an end face of the laser chip 40 as shown in FIG. 13 so that the half-value width of the oscillation wavelength of the indirect semiconductor laser can be adjusted. It is noted that FIG. 13 shows a laser chip structure for end face emission, and accordingly, if a configuration of a surface emission laser of a vertical resonance type is selected, a multi-layer structure having a thickness of a ¼ wavelength is added to each of opposite sides of the active layer and the first barrier layer. For example, a multi-layer structure in which a GaP layer having a thickness of 42 nm, and an AlP layer having a thickness of 49 nm are alternately repeated by 10 periods may be inserted on both outsides of the active layer and the first barrier layer.

Further, the half-width of oscillation in a broad band is affected by a carrier distribution which depends upon a temperature, and accordingly, with the provision of the cooler as in this embodiment, the half-value width of the spectrum which is determined by Phonon dispersion can be adjusted in dependence upon a temperature. For example, as shown in FIG. 13, the laser chip 40 is fixed to a mount on a Peltier cooler 42, and the indirect semiconductor laser is oscillated while the chip is cooled by the cooler so as to adjust the half-value width of the spectrum in order to effect the oscillation.

By incorporating these functions into the element of the indirect semiconductor laser, the half-value width of the laser can be improved so as to satisfy its object.

Embodiment 2

Configuration 1 of Optical Disc Apparatus

Figure 14:
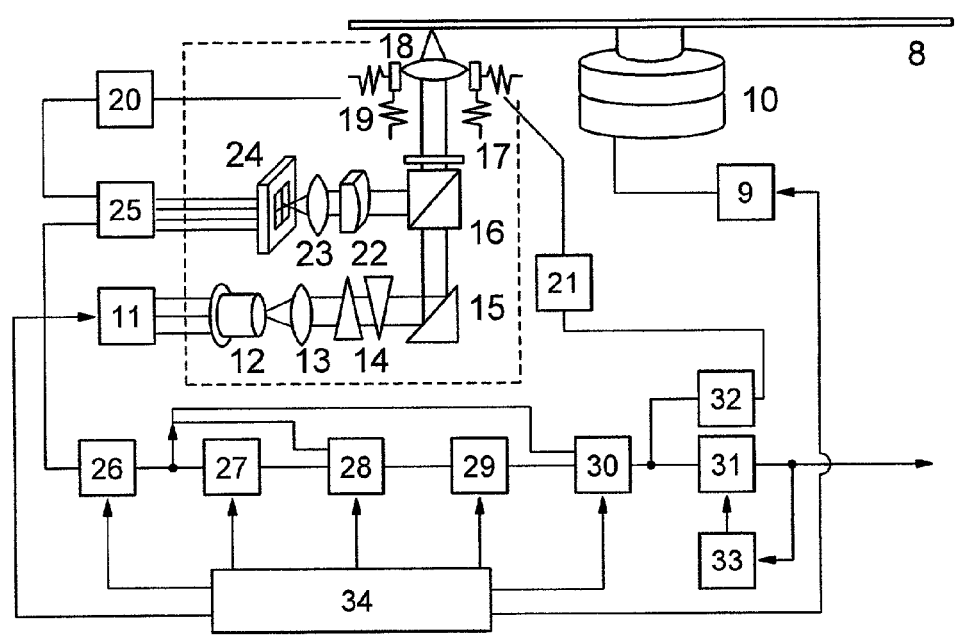
FIG. 14 is a view illustrating an example of the configuration of an optical disc apparatus having an indirect semiconductor laser as a light source.

Next, an example of the configuration of the optical disc apparatus according to the present invention will be explained with reference to FIG. 14 which shows an example of the configuration of an optical disc apparatus using an indirect semiconductor laser as a light source for an optical head.

A part surrounded by a dotted line is an optical head part attached to a part which is mechanically moved. A light beam emitted from the indirect semiconductor laser is focused by means of a lens in order to detect a reflected beam which has been modulated by a recording pattern on a medium, by means of a detector. In this example of the configuration, a quadrant optical detector 24 is used as the detector. This configuration will be hereinbelow detailed.

An optical disc medium 8 having a pattern in which data is recorded by variation in optical reflectance, is set on a motor 10 which is controlled so as to rotate as a constant speed by means of a rotation servo circuit 9, and is therefore rotated. A laser beam is emitted from the indirect semiconductor laser 12 which is driven by an indirect semiconductor laser driver 11, and is then turned into a parallel light ray beam by means of a collimator lens 13. Thereafter, it is shaped by a beam shaping lens 14, and is then reflected by a reflector 15 so as to be led toward the optical disc medium 8. This beam passes through a beam splitter 16 and a quarter wavelength plate 17, and is then converged by an objective lens 18 so as to be irradiated onto the optical disc medium 18. The objective lens 18 is provided on an actuator 19 so as to be movable in the focus depthwise direction and the radial direction of the disc medium in response to an electric signal. The control is made by a focus servo circuit 20 in the focus depthwise direction, and by a tracking servo circuit 21 in the radial direction of the disc medium so that the converged and irradiated light beam is focused onto the pattern on a desired track. It is noted that the pit height of a pit pattern recorded on the optical disc medium 8 is adjusted in accordance with a refraction index of the material (it is normally polycarbonate or the like) of the medium so that the phases of reflected light from the pit part and a non-pit part are different from each other by 180 deg. It is noted that a recording film material conventionally having 650 nm may be directly used.

The reflected light beam which has been modulated by the pattern on the optical disc medium 8 is returned through the objective lens 18 so as to be turned into the parallel light ray beam, and after passing through the quarter wavelength plate 17, it is reflected by the polarized beam splitter 16 so as to be led through a cylindrical lens 22 and a converging lens 23 in order to be irradiated onto the quadrant detector 24. The symmetry of the pattern of the light beam is changed in accordance with a focus depth of the objective lens 18 on the quadrant detector 24. This is then photoelectrically detected, and accordingly, a defocus can be detected in the form of an electric signal which is amplified by a photocurrent amplifier 25 in order to be fed-back to the focusing servo circuit 20, thereby it is possible to materialize the automatic focus adjustment.

Meanwhile, the reflected light signal amplified by the photocurrent amplifier 25 is processed so as to be also used for reproduction of the data. A signal from the photocurrent amplifier 25 is at first corrected by an equivalent circuit 26 in accordance with a frequency and a reflected light volume. Next, this signal is fed into a level detecting circuit 27, a synchronization detecting circuit 28 and a sampling circuit 30. The level detecting circuit 27 detects an synchronization signal indicating a leading end of the synchronized pattern. After receiving this signal, the synchronization detecting circuit 28 produces a synchronization timing signal synchronized with a rotational speed of the optical disc medium 8. This signal is then received into a phase lock circuit 29 which then produces a multiplied signal synchronized with the synchronization timing signal. This multiplied signal is fed as a sampling lock into a sampling circuit 30 so as to sample a reproduction signal in accordance with a passing pint of modulated data. The thus sampled reproduction signal is fed to a demodulating circuit 31 and a tracking error detecting circuit 32. In the demodulating circuit 31, modulated signals are subjected to decoding conversion, and simultaneously, it is stored in a memory 33 so as to be used for decoding bit signals which are read at the next time. Meanwhile, from the sampled reproduction signal which has been fed into the tracking error detecting circuit, a signal indicating an edge position from which a deviation of tracking, corresponding to a serve bit can be detected is extracted, and a deviation from an ideal track position is fed-back into the servo tracking circuit 21. Accordingly, the tracking for the focus point can be made. It is noted that the servo circuit, the drive circuit and the signal processing circuit are supervisorily controlled by a main control circuit 34.

A decoded bit signal delivered from the decoding circuit 31 is processed in accordance with an object of the use thereof, and accordingly, data recorded on the disc medium can be used. In general, processes such as error correction, decoding of scramble and the like are carried out.

With the use of the indirect semiconductor laser which has been explained in this embodiment, the synchronization and the signal process can surely be made even with a high density optical disc having a specification which is severe for laser noise. Thereby it is possible to provide a higher density optical disc apparatus which is highly reliable by reducing laser noise and optical interference noise.

Simultaneously, the necessity of high frequency wave convolution can be eliminated so as to reduce the cost, and as well the transmission rate which has been limited by a frequency of the high frequency wave convolution can be enhanced, thereby it is possible to reproduce and transmit data at a high rate in an apparatus or a product using the optical disc apparatus according to the present invention.

Thus, with the use of the indirect semiconductor laser as a light source, a light beam having a broad spectrum can be used as a light beam for reading a pattern on a medium, and optical interference noise in the optical head can be greatly reduced. There may be presented such an advantage that the high frequency wave convolution is not required, and accordingly, the reproduction rate for recording data on the disc medium, which has been limited by the frequency can be greatly enhanced. Since the provision of a circuit for the high frequency of the high frequency wave convolution on an optical head (a movable part), which has been required in a conventional configuration, is not required, the optical head can be small-sized while the electric wiring is minimized.

Figure 15:
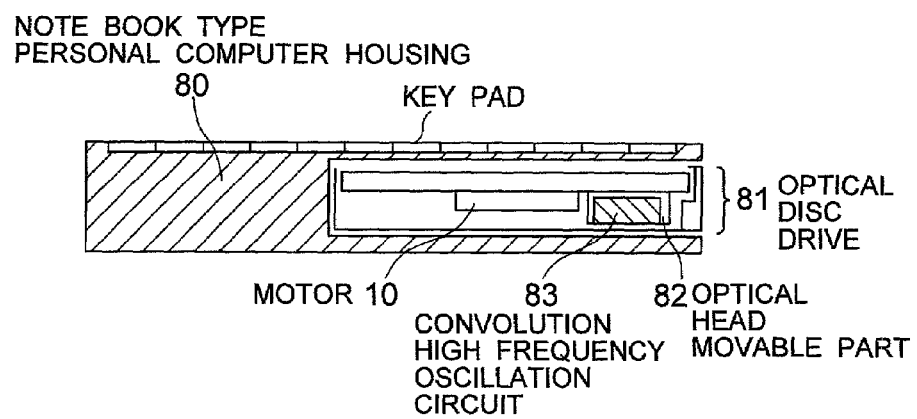
FIG. 15 is an example of a configuration of a computer equipment incorporating an optical disc apparatus.

As the optical head can be small-sized, the size of computer equipment such as a notebook type personal computer incorporating an optical disc apparatus can be itself decreased. For example, in a notebook type personal computer incorporating an optical disc drive as shown in FIG. 15, the size of an optical head movable part 82 determines the thickness of the optical disc drive 81, and the necessity of a convoluted high frequency wave oscillation circuit 83 is eliminated, thereby the optical head movable part 82 can be small-sized and lightweight. Thus, the height of the optical disc drive 81 itself can be restrained to a low value, thereby it is possible to reduce the thickness of the housing 80 of the notebook type personal computer. Further, since the data transmission rate of the optical disc apparatus can be increased, the operational speed of computer equipment can be enhanced.

Embodiment 3

Configuration 2 of Optical Disc Apparatus

Figure 16:
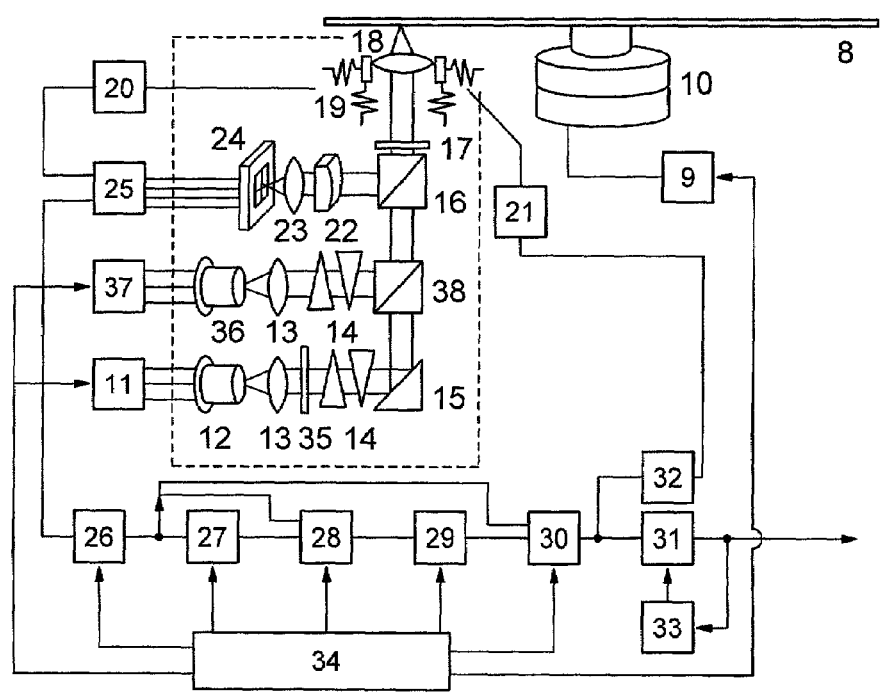
FIG. 16 is a view illustrating an example of the configuration of an optical disc apparatus having an indirect semiconductor laser as a light source, and using two semiconductor lasers.
Figure 17A:
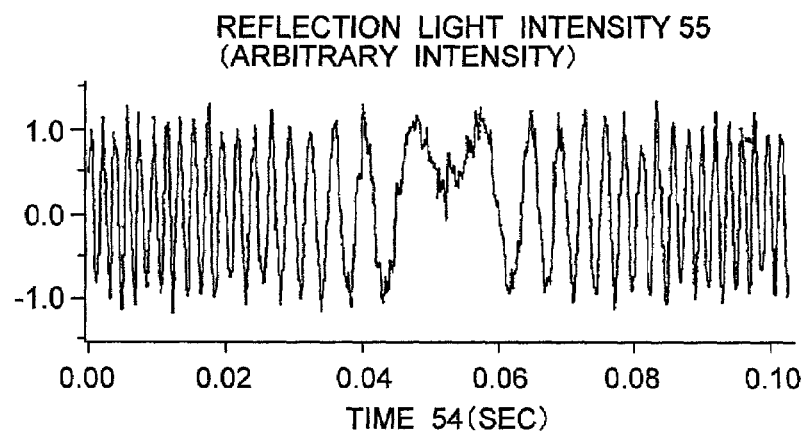
FIGS. 17a and 17b are views showing comparison of examples of optical interference noise caused by light reflection within an optical head between the case of using a direct semiconductor laser and the case of using an indirect semiconductor laser.
Figure 17B:
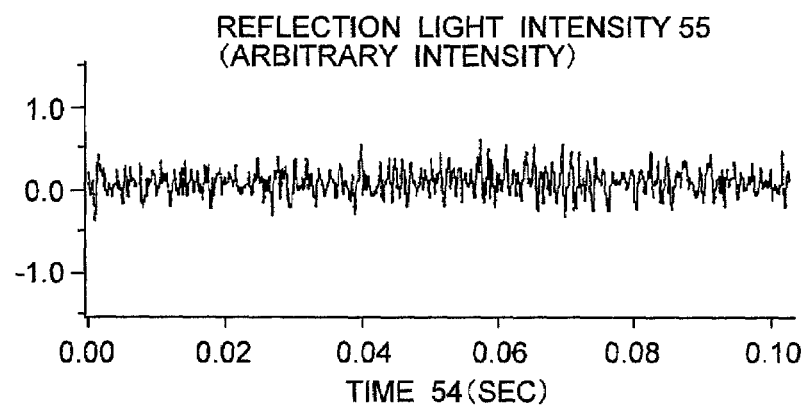
Figure 18:
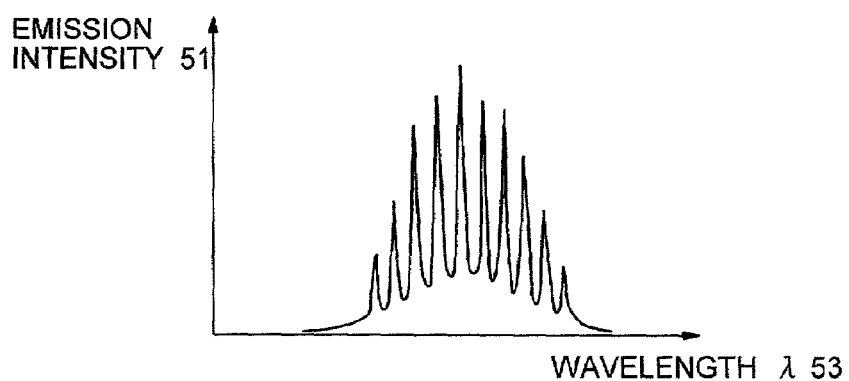
FIG. 18 is a view illustrating an example of oscillation spectrum during multi-mode oscillation by self-excitation and high frequency wave convolution in a direct semiconductor laser.

Next, in an example of the configuration of the optical disc apparatus according to the present invention, explanation will be hereinbelow made of such a case that two semiconductor lasers are used as a reproducing light source and a recording light source, respectively, with reference to FIG. 16. The indirect semiconductor laser is used as the reproducing light source while a direct semiconductor laser which has been conventionally used is used as the recording light source.

The use of the indirect semiconductor laser as the light source, and the optical system and the signal processing system for reproducing data, and the operation thereof are the same as those as mentioned above, and accordingly, difference from the example of the configuration shown in FIG. 14 which shows the configuration of the above-mentioned embodiment will be explained here. The configuration and the operation of the other parts are similar to those of the configuration in the above-mentioned embodiment.

The difference from the above-mentioned embodiment (FIG. 14) is: (1) the direct semiconductor laser is present as a recording light source, and an optical system for the recording light source is incorporated, in addition to the reproducing light source, and (2) a waveband pass filter 35 is added in the optical system for the recording light source.

As to the difference (1), the recording light source is provided independent from the reproducing light source (indirect semiconductor laser), the direct semiconductor laser having conventionally had know-how as to recording control, and a drive circuit therefor can be used. Only during recording of data onto an optical disc medium, the direct semiconductor laser 36 is driven by a direct semiconductor laser driver 37, and a writing beam is directed onto the disc side by a beam splitter 38. Current fed by the driver is modulated so as to record data on the optical disc medium.

Since the half-value width is broadened with the use of the indirect semiconductor laser, the waveband pass filter 35 in the difference (2) is used for solving a problem in which astigmatism of a lens is serious as a side effect caused by the half-value wise which has been too broad. In general, in the optical system in an optical disc apparatus, when a data is read from a high density optical disc, if the spectrum of a reproducing light source is too broad, the astigmatism of a lend becomes larger, and there is caused such a side effect that the light beam cannot be converged into the same size as a spot diameter. In order to restrain the aberration in a suitable range, it is desirable to restrain the half-value width of the spectrum to a value which is not greater than 0.3% of the light wavelength. If it is considered that the light wavelength used in general for an optical disc is in a range of 650 to 780 nm, it is desirable to set the half-value width to a value which is not greater than 2 nm. Accordingly, the light beam emitted from the indirect semiconductor laser 12 and having a wide half-value width is led through the waveband pass filter 35 so as to suitably adjust the half-value width which is therefore restrained to be not greater than the above-mentioned value, and is then used for reproducing data recorded on the optical disc medium. Accordingly, the astigmatism of the lend can be restrained, thereby it is possible to reproduce a pattern on a high density optical disc medium. Further, if the half-value width of the spectrum is ensured around the value, the effect of reducing optical interference noise of the laser can be sufficiently obtained with no inferior. It is noted that this waveband pass filter may be used in the configuration of the optical disc in the above-mentioned embodiment 2.

Manifestability

It is noted that with the optical head and the optical disc apparatus which are constructed as mentioned above, a light beam emitted for reading a disc medium, becomes a light beam having a smooth continuous spectrum with a wide peak, as mentioned above, in comparison with a direct semiconductor laser which has been used in a conventional optical disc apparatus. The use of the indirect semiconductor for the laser can be determined more or less in view of confirmation of transparency by microscopically monitoring the chip, in addition to the above-mentioned measurements of an optical spectrum. Further, a used semiconductor material can be specified by using a secondary ion mass spectrum analysis (SIMS), and further, it can be identified by analyzing a phonon spectrum inherent to the material through microscopic Raman scattering measurements.

As mentioned above, according to the present invention, with the use of an indirect semiconductor lens, a light beam for reading data in an optical disc apparatus can be tuned into the one which has a continuous spectrum with substantially no noise caused by optical interference. Accordingly, even in a reproducing system of an optical head in which optical noise from a semiconductor would be serious, an S/N ratio (signal/noise ratio) of a reproducing signal can be ensured while occurrence of noise caused by optical interference and laser noise can be prevented. Further, the necessity of high frequency wave convolution can be eliminated, and accordingly, a high frequency wave convolution circuit can be eliminated, thereby it is possible to reduce the const. Further, the recording/reproducing rate (bit rate) which has been limited by a convolution high frequency can be enhanced.

What is claimed is:

1. An optical head comprising: semiconductor laser for emitting a light beam, a lens for focusing the light beam onto a medium, and a detector for detecting a reflected light beam from the medium, said semiconductor laser comprising an active layer and at least one barrier layer, wherein said active layer is formed of an indirect bandgap semiconductor in an asymmetric quantum structure in which a bandgap is defined between a quantum well of a conduction band and an adjacent quantum well of a valence band, and each of the quantum wells has two walls which are asymmetric with respect to a center of the quantum well, and said optical head further comprises means for supplying a driving current for said semiconductor laser to stabilize a broadband oscillation.

2. An optical head as set forth in claim 1, wherein the semiconductor laser has a barrier layer, which is also said indirect semiconductor.

3. An optical head as set forth in claim 1, wherein said indirect semiconductor is made of an indirect semiconductor mixed crystal material.

4. An optical head as set forth in claim 1, wherein said optical head is used for reproducing information from the medium.

5. An optical head as set forth in claim 1, wherein the indirect semiconductor has an adjacent confinement structure.

6. An optical head as set forth in claim 1, wherein the material of the indirect semiconductor is of an AlGaP (aluminum, gallium and phosphor) group.

7. An optical head as set forth in claim 6, wherein said light beam has a continuous spectrum of which a half-value width of a main peak is not less than 20 meV but not greater than 400 meV in the form of optical energy range.

8. An optical head as set forth in claim 6, wherein said light beam has a continuous spectrum of which a half-value width of a main peak is not less than 6 nm but not greater than 100 nm.

9. An optical head as set forth in claim 1, wherein the material of the indirect semiconductor is of a SiGe (silicon germanium) group.

10. An optical head as set forth in claim 9, wherein said light beam has a continuous spectrum of which a half-value width of a main peak is not less than 20 meV but not greater than 150 meV in optical energy range.

11. An optical head as set forth in claim 9, wherein said light beam has a continuous spectrum of which a half-value width of a main peak is not less than 13 nm but not greater than 90 nm at a room temperature.

12. An optical head as set forth in claim 1, wherein a direct current (dc) drive is used for driving the semiconductor laser.

13. An optical head as set forth in claim 1, comprising a multi-layer film reflector provided at an end face of a resonator.

14. An optical head as set forth in claim 1, comprising a waveband pass filter for limiting the wavelength of the light beam from the semiconductor laser to be less a half-value width of 2 nm.

15. An optical head as set forth in claim 1, comprising a cooler for lowering the temperature of a light emitting part of the semiconductor laser.

16. An optical disc apparatus using an optical head as set forth in claim 1.

17. An optical head as set forth in claim 1, wherein the half-width of the main peak is in a range from 6 nm to 10 nm.

18. An optical head as set forth in claim 1, wherein said active layer is formed of a first layer constituting the quantum well of the conduction band and a second layer constituting the quantum well of the valence band, the first and second layers are made of different materials.

19. An optical head as set forth in claim 18, wherein the first layer is made of AlP, the second layer is made of GaP, and said at least one barrier layer includes two barrier layers which are made of AlGaP and sandwich said active layer in-between.

20. An optical head as set forth in claim 1, wherein said means for supplying a driving current is a laser driver that supplies the driving current above a threshold value of said broadband oscillation, and the driving current avoids excitation causing a single mode oscillation and a multimode oscillation.

* * * * *